(12) United States Patent
Scott

(10) Patent No.: US 6,684,116 B1
(45) Date of Patent: Jan. 27, 2004

(54) METHOD AND APPARATUS FOR INCORPORATING FEATURES IN SHEET BODIES

(75) Inventor: Phillip J. Scott, San Diego, CA (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 09/494,898

(22) Filed: Jan. 31, 2000

(51) Int. Cl.[7] ............................................. G06F 19/00
(52) U.S. Cl. ........................................ 700/98; 700/127
(58) Field of Search ...................... 700/95–98, 117–122, 700/127, 145, 180–189; 345/649–688, 848–852, 418–428

(56) References Cited

U.S. PATENT DOCUMENTS

| | | | | |
|---|---|---|---|---|
| 4,912,644 A | * | 3/1990 | Aoyama et al. | 364/468.04 |
| 5,255,352 A | * | 10/1993 | Falk | 395/125 |
| 5,969,973 A | * | 10/1999 | Bourne et al. | 364/474.07 |
| 6,128,020 A | * | 10/2000 | Arimatsu et al. | 345/420 |
| 6,327,514 B1 | * | 12/2001 | Hazama et al. | 700/145 |
| 6,337,685 B2 | * | 1/2002 | Nagakura | 345/419 |

* cited by examiner

Primary Examiner—Maria N. Von Buhr
(74) Attorney, Agent, or Firm—Schwabe, Williamson & Wyatt, P.C.

(57) ABSTRACT

Computer instructions that operate to project a first three dimensional geometry piece of a mechanical design onto a two dimensional plane forming a projected geometry piece, build a two dimensional feature on the projected geometry piece are disclosed, and build a relationship between the two dimensional feature and the projected geometry piece. Once the relationship is built, the instructions operate to convert the two dimensional feature into a three dimensional feature and incorporate the three dimensional feature including the relationship with the first three dimensional geometry piece to form a second three dimensional geometry piece with the incorporated feature. In one embodiment, the computer instructions are part of a mechanical design software application. In one embodiment, the mechanical software application including the computer instructions are embodied in distribution storage medium.

21 Claims, 10 Drawing Sheets

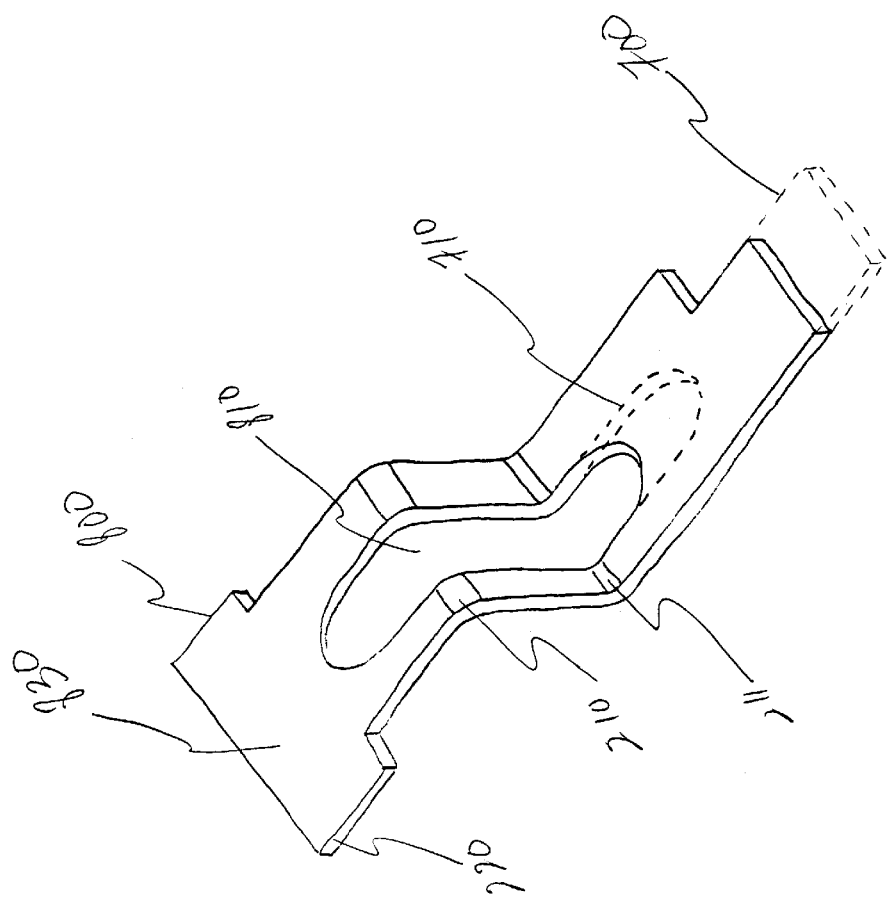

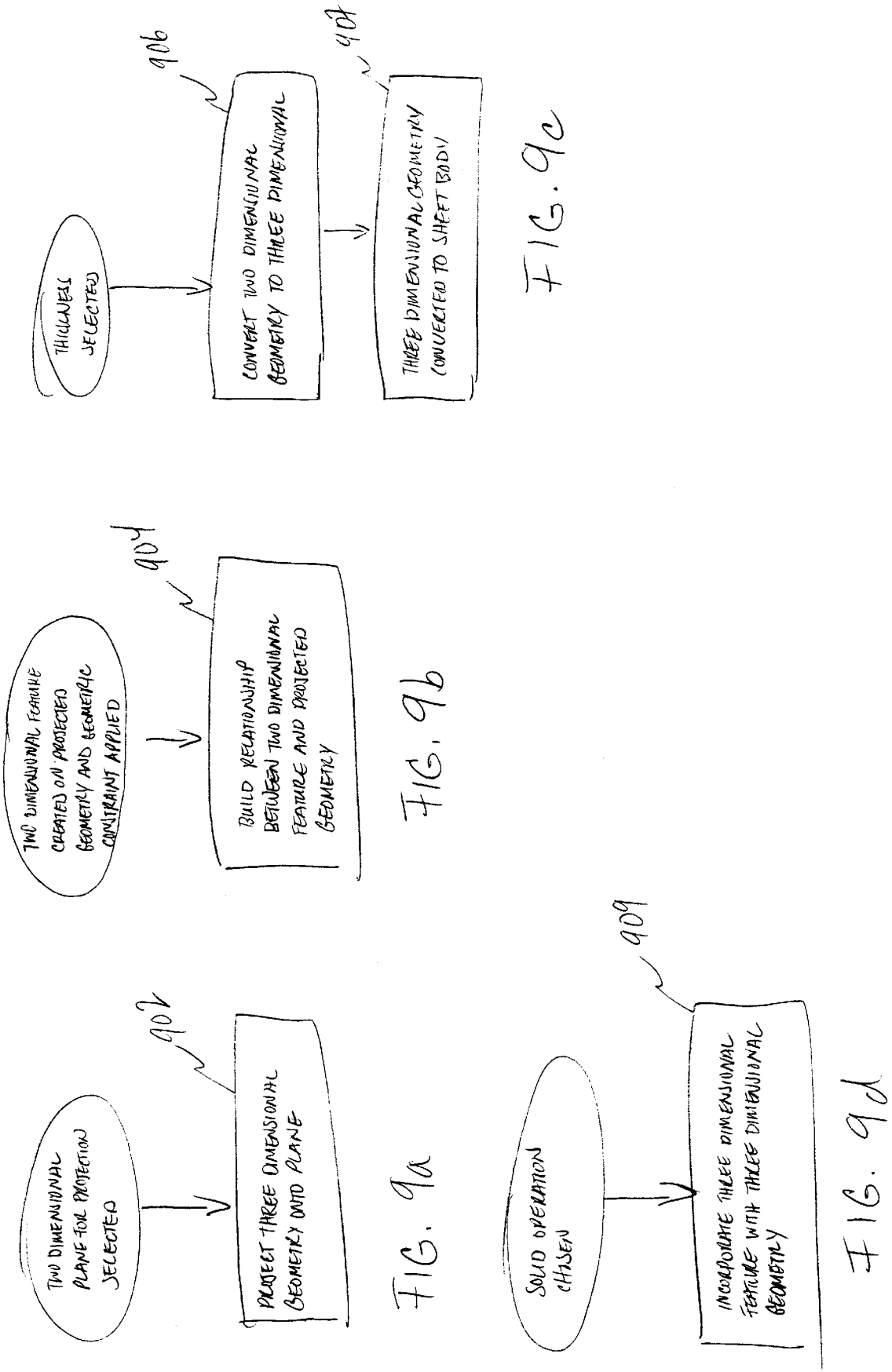

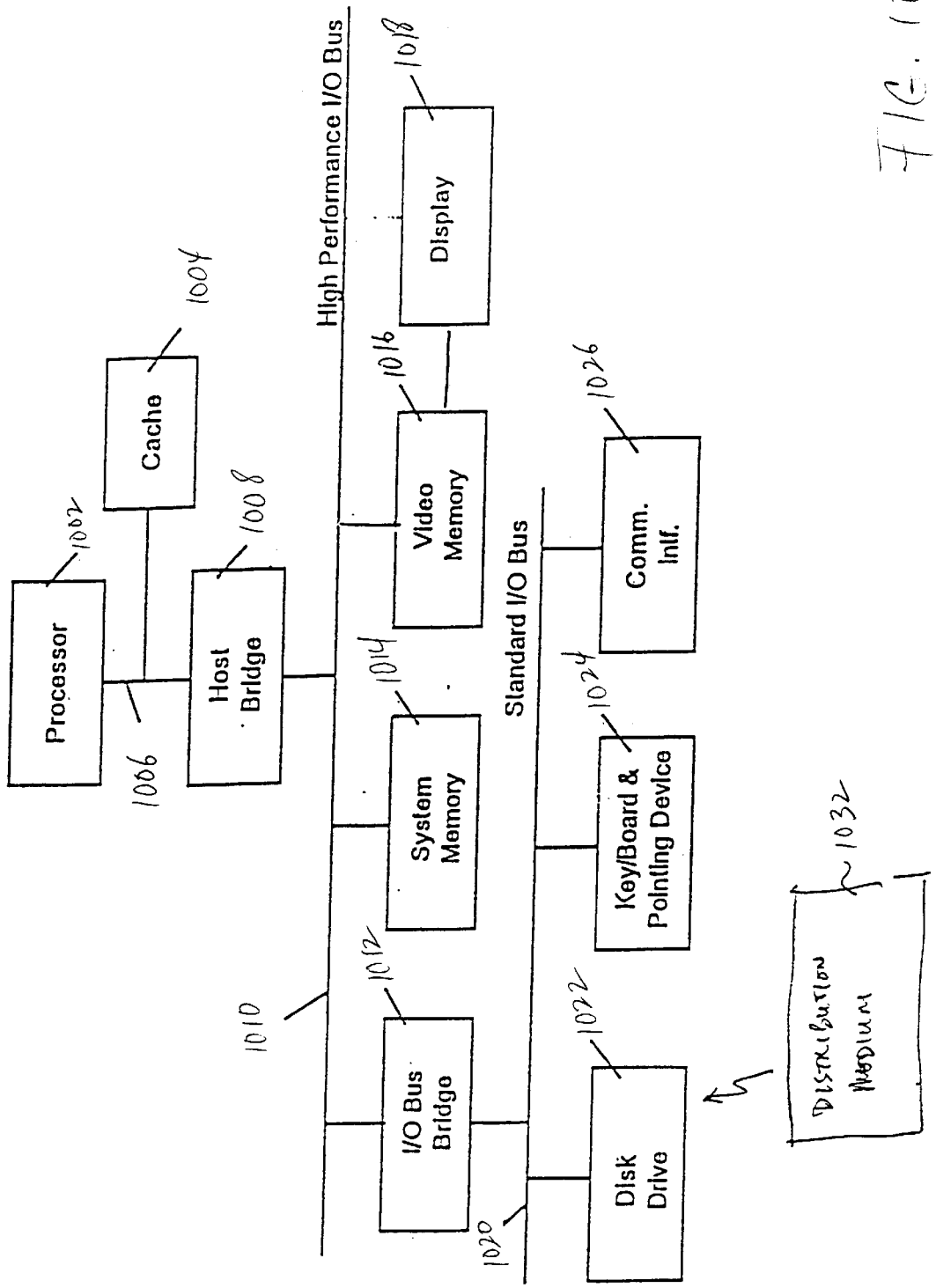

METHOD AND APPARATUS FOR INCORPORATING FEATURES IN SHEET BODIES

FIELD OF INVENTION

The present invention relates to the field of computer aided design (CAD). More specifically, the present invention relates to computer assistance to a designer working with features of a sheet body of a mechanical design.

BACKGROUND OF THE INVENTION

Mechanical designs can require the creation of a solid geometry piece in the form of a sheet body. An example of a sheet body is a thin piece of solid geometry that can have bends such as a design of a sheet-metal body for stamping. Most sheet bodies require features to be incorporated as part of the sheet body. An example of a feature incorporated into a sheet body is a cutout such as a slot. Yet, another example are holes for fasteners drilled into the sheet body during the manufacturing process. Not all features remove material, some add material instead. An example of a feature that adds material is a pad on the sheet body for attachment purposes. For the purposes of this application, hole, cutouts, etc. will be generically referred to as features. Additionally, for the purposes of this application, sheet bodies such as metal, plastic, wood, etc. will be generically referred to as sheet bodies.

Generally, only limited support are provided by conventional mechanical design software on feature creation on sheet bodies. Typically, the support is limited to a method involving straightening any existing bends in the sheet body, creating a feature in the straightened sheet body, performing a solid operation, and re-bending the sheet body to the original shape. Thus, extensive manipulation of the sheet body is required for incorporation of features. Additionally, once the feature is incorporated into the sheet body, editing the feature or the sheet body while maintaining the desired relationships between the two is very difficult, at times, requiring re-creation of one or the other. Thus, a more user friendly approach for incorporating and editing features in a sheet body is desired. As will be discussed in more detail below, the present invention achieves these and other desirable objectives, which will be apparent from the disclosure to follow.

SUMMARY OF THE INVENTION

Computer instructions that operate to project a first three dimensional geometry piece of a mechanical design onto a two dimensional plane forming a projected geometry piece, build a two dimensional feature on the projected geometry piece are disclosed, and build a relationship between the two dimensional feature and the projected geometry piece. Once the relationship is built, the instructions operate to convert the two dimensional feature into a three dimensional feature and incorporate the three dimensional feature including the relationship with the first three dimensional geometry piece to form a second three dimensional geometry piece with the incorporated feature. In one embodiment, the computer instructions are part of a mechanical design software application. In one embodiment, the mechanical software application including the computer instructions are embodied in distribution storage medium.

BRIEF DESCRIPTION OF DRAWINGS

The present invention will be described by way of exemplary embodiments, but not limitations, illustrated in the accompanying drawings in which like references denote similar embodiments, and in which:

FIG. 8 illustrates an example of incorporating the three dimensional feature and editing the first three dimensional geometry piece;

FIGS. 9a–9d illustrate the relevant operational flows of one embodiment of sheet body design manager; and FIG. 10 illustrates one embodiment of a computer system suitable to be programmed with the mechanical design drawing application of the present invention.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps in turn, in a manner that is most helpful in understanding the present invention, however, the order of description should not be construed as to imply that these operations are necessarily order dependent. In particular, these operations need not be performed in the order of presentation.

Figure 1:
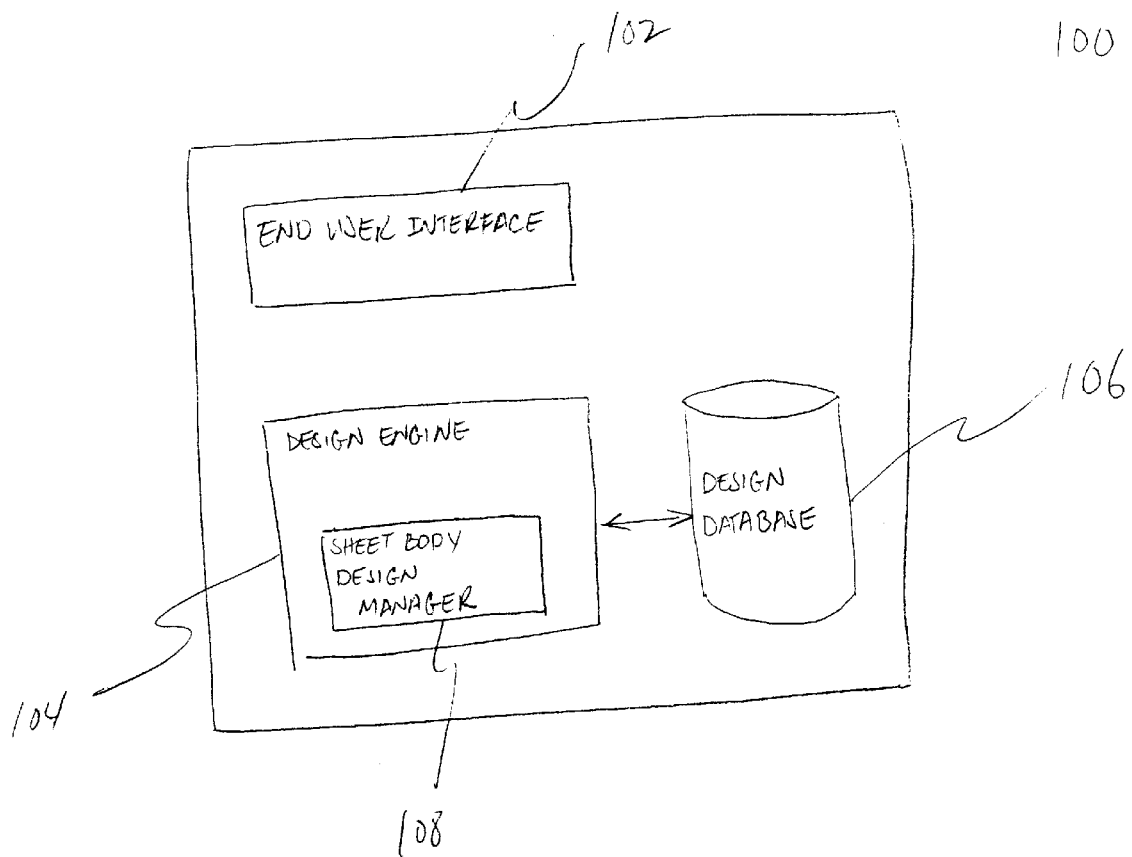
FIG. 1 illustrates one embodiment of a mechanical design application incorporated with the teachings of the present invention.

Referring now to FIG. 1, wherein a block diagram illustrating one embodiment of a mechanical design application is shown. As illustrated, mechanical design application 100 includes end user interface 102, design engine 104, and design database 106. Design engine 104 includes in particular sheet body design manager 108 incorporated with the teachings of the present invention. Together, the elements cooperate to facilitate designing of sheet bodies of mechanical designs by a designer. More specifically, end user interface 102 operates to facilitate graphical displays and input of sheet bodies of mechanical designs for the designer, under the control of design engine 104. Design database 106 facilitates storage of mechanical designs created by the designer, also under the control of design engine 104. In particular, sheet body manager 108 projects three dimensional sheet bodies onto a two dimensional plane and facilitates incorporation of features into the sheet body. Except for the teachings of the present invention incorporated in design manager 108, mechanical design application 100 is intended to represent a broad range of computer aided design (CAD) drawing software known in the art, including but not limited to Mechanical Desktop®, available from Autodesk, Inc. of San Rafael, Calif.

Figure 2:
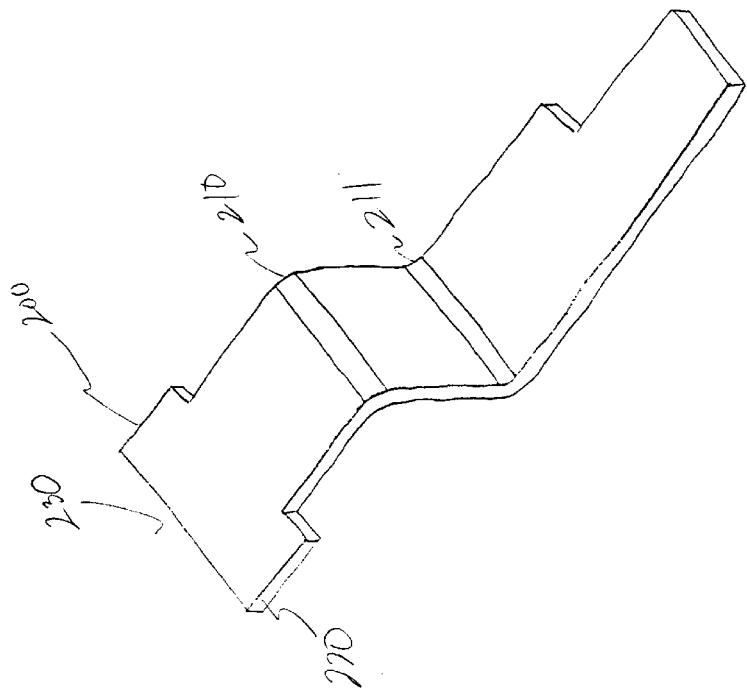
FIG. 2 illustrates a solid three dimensional geometry piece of a mechanical design into which a designer intends to incorporate a feature, i.e. a slot, holes, etc.

FIG. 2 illustrates a solid three dimensional geometry piece of a mechanical design into which a designer intends to incorporate a feature, i.e. a slot, holes, etc. The particular geometry piece of the mechanical design is a sheet body 200. As illustrated in FIG. 2, sheet body 200 includes bends 210 and 211, a thickness 220, and a total surface area 230 of one side of the sheet body 200. As illustrated, the sheet body 200 has two bends 210 and 211, however, it should be appreciated that the number of bends can be any number required to create a sheet body. Additionally, the bends 210 and 211 can be any type of surface discontinuity known in the art such as but not limited to corners or any other discontinuity. Furthermore, the surface area 230 and thickness 220 can be of any quantity desired by a designer for creation of any form of sheet body. For the illustration of the embodiment of the present invention, a sheet body 200 is shown, however, it should be appreciated that any type of three dimensional geometry known in the art may be used such as but not limited to three dimensional solid bodies.

Figure 3:
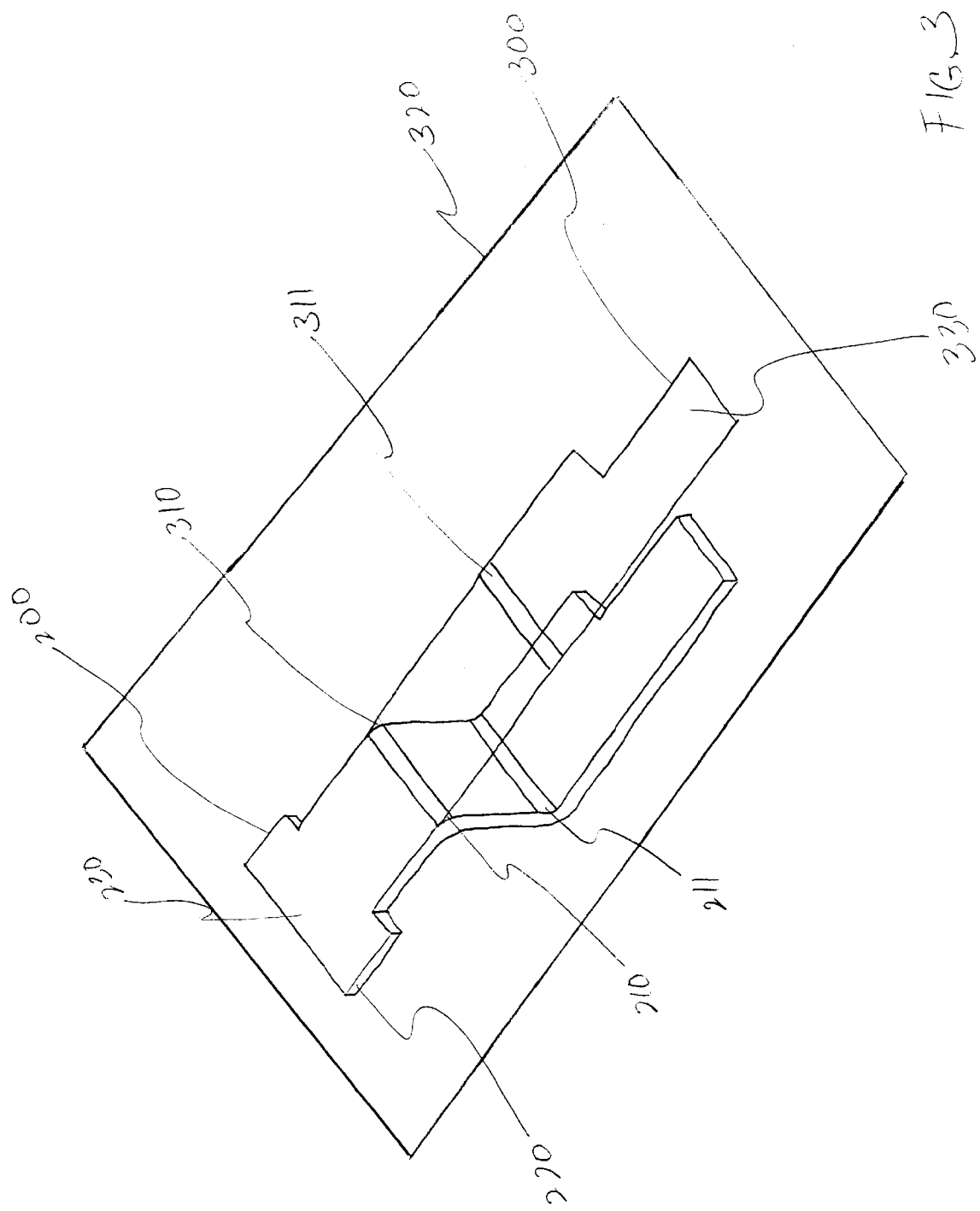
FIG. 3 illustrates a first aspect of the present invention, the projection of a three dimensional geometric piece of a mechanical design onto a two dimensional plane.

FIG. 3 illustrates a first aspect of the present invention, the projection of a three dimensional geometric piece of a mechanical design onto a two dimensional plane. Once a designer has chosen a projection plane for feature creation, as illustrated in FIG. 3, the sheet body design manager 108 operates to project a three dimensional geometric body, in the form of a sheet body 200, onto a two dimensional plane 320 and create a projected geometry 300. As shown in FIG. 3, sheet body design manager 108 further operate to include the bends 210 and 211 of the sheet body 200 with the projected geometry piece 300 and are shown as areas 310 and 311. Additionally, the sheet body design manager 108 operates to control the surface area 230 of the sheet body and the surface area 330 of the projected geometry piece 300. Once the sheet body 200 is projected resulting in the projected geometry piece 300, the sheet body design manager 108 operates to geometrically constrain the projected geometry piece 300 with the sheet body 200. For the illustrated embodiment, the two dimensional plane 320 is on the same plane as a surface of the sheet body 200, however, it should be appreciated that the two dimensional plane can be any plane such as, but not limited to, an angled plane a distance away from the sheet body.

Figure 4:
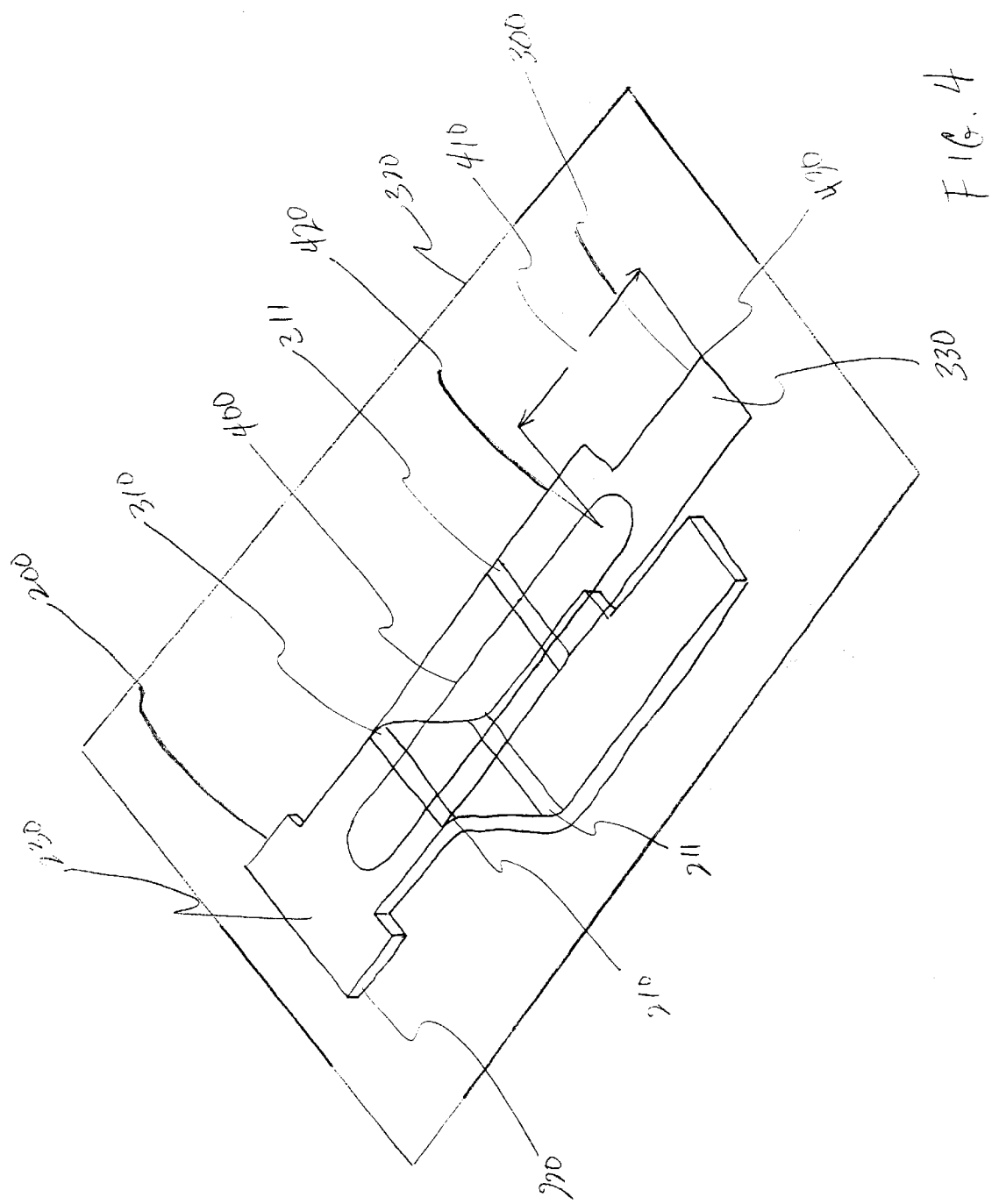
FIG. 4 illustrates a second aspect of the present invention, building a relationship between a two dimensional feature and the projected geometry.

FIG. 4 illustrates a second aspect of the present invention, building a relationship between a two dimensional feature and the projected geometry. As shown in FIG. 4, a two dimensional feature 400 created by a designer is placed on the projected geometry piece 300 both on the two dimensional plane 320 allowing a designer to work in a single plane for geometric constraint construction. Additionally, illustrated in FIG. 4, the two dimensional feature 400 is geometrically constrained by the designer to the projected geometry piece 300 thereby indirectly constraining the two dimensional feature 400 to the sheet body 200. In FIG. 4, the two dimensional feature 400 and the projected geometry piece 300 are geometrically constrained by a linear geometric constraint 410 from a center point 420 on the two dimensional feature 400 to a line 430 on the projected geometry piece 300. As shown, the two dimensional feature 400, the projected geometry piece 300, and the geometric constraint 410 are all on the two dimensional plane 320.

For the illustrated embodiment in FIG. 4, the two dimensional geometry piece 400 is in the shape of an oval, however, it should be appreciated that the shape of the two dimensional feature is user dependent and can be of any desired shape known in the art. Additionally, the geometric constraint 410 applied between the two dimensional feature 400 and the projected geometry piece 300 is a linear geometric constraint, however, it should be appreciated that the geometric constraint can be any number of geometric constraints known in the art including, but not limited to, both a point and a tangent geometric constraints. Thus, under the present invention, a designer may create features in sheet bodies or any other type of solid geometry by working in a two dimensional plane and simplifying the graphical representation without having to extensively manipulate the solid geometry as in the prior art. Furthermore, one skilled in the art will appreciate that creating geometric constraints between solid geometry and a feature is simplified over the prior art because of the fact that the geometric constraints are created in one plane for both objects without altering the original sheet body.

Figure 5:
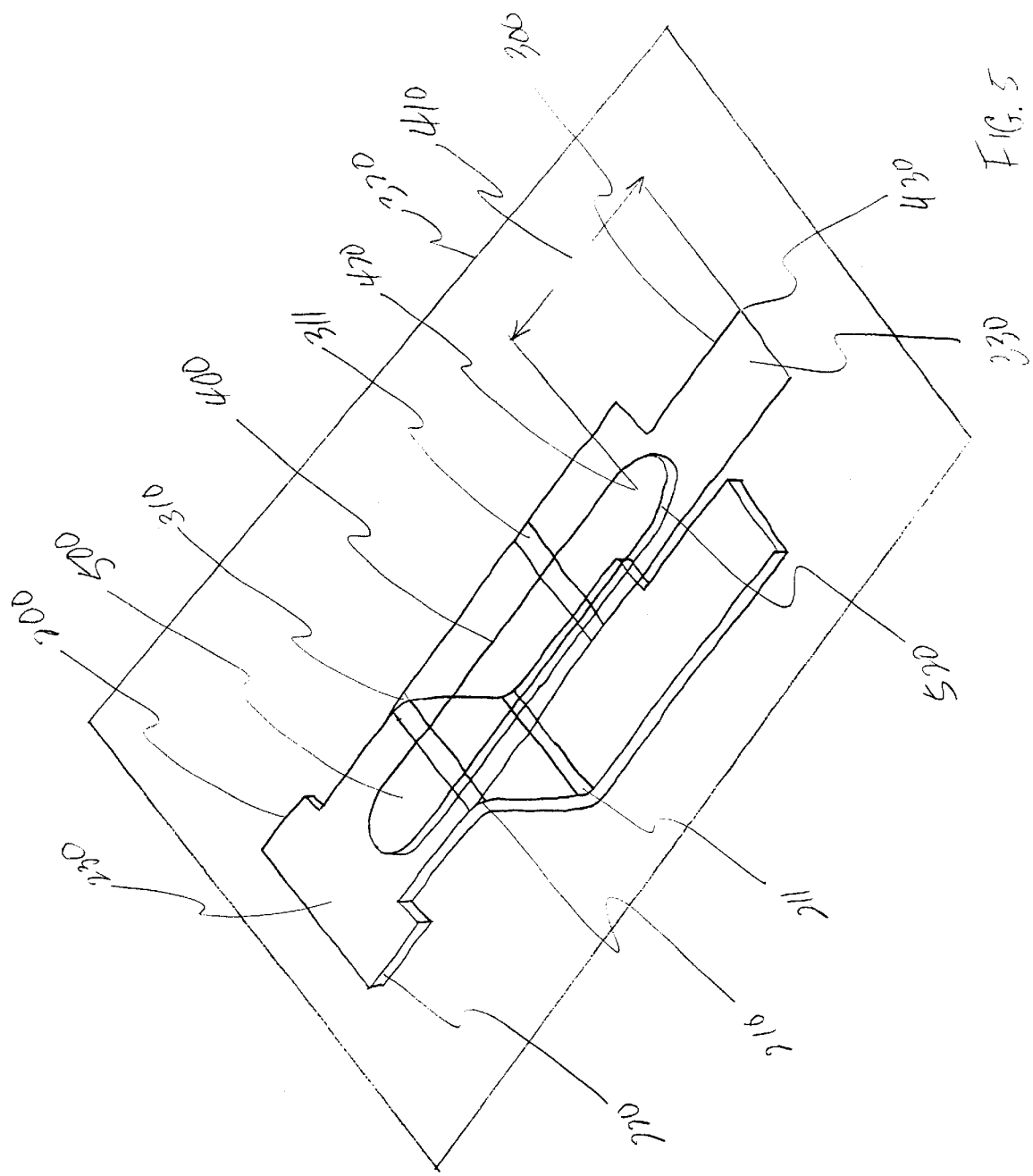
FIG. 5 illustrates a third aspect of the present invention, converting the two dimensional feature into a three dimensional feature.

FIG. 5 illustrates a third aspect of the present invention, converting the two dimensional feature into a three dimensional feature. In FIG. 5, the two dimensional feature 400 in the two dimensional plane 320 is extruded to form an extruded three dimensional feature 500 with thickness 520. As illustrated in FIG. 5, the thickness 520 of the extruded geometry piece 500 is the equal to the thickness 220 of the sheet body 200. Additionally, since the extruded geometry 500 is created from the two dimensional feature 400, the sheet body design manager 108 will automatically constrain the extruded geometry 500 to the two dimensional feature 400 including the linear geometric constraint 410. In the illustrated embodiment of the present invention, the sheet body design manager 108 operates to extrude the thickness 520 to match the thickness 220 of the sheet body 200, however, it should be appreciated that the thickness can be of any dimension.

Figure 6:
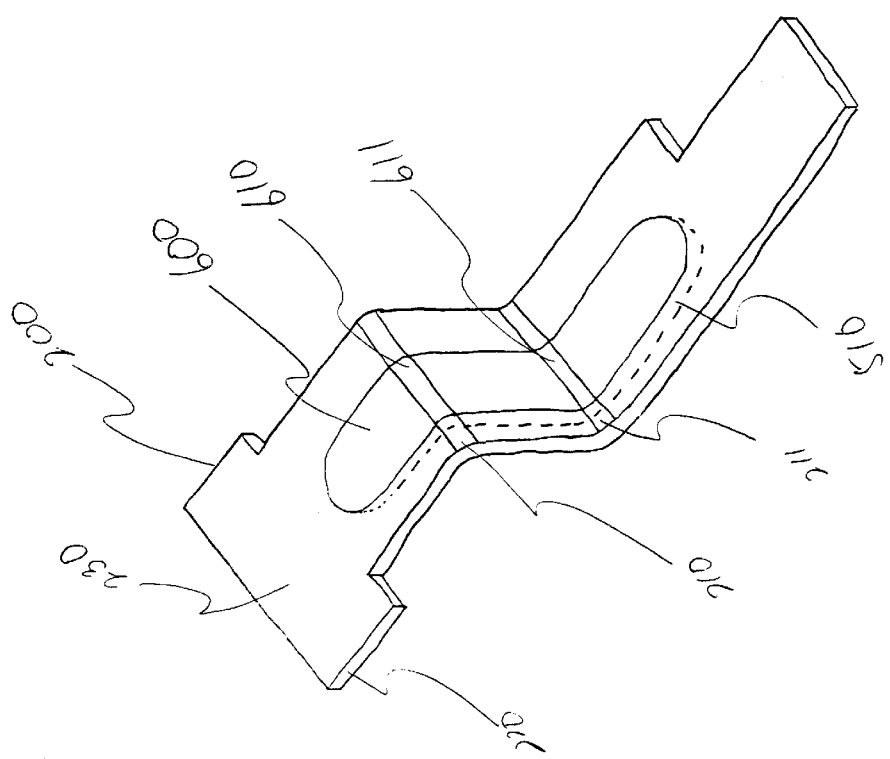
FIG. 6 further illustrates the third aspect of the present invention, converting the two dimensional feature into a three dimensional feature, and in particular, a feature sheet body to match the target sheet body.

FIG. 6 further illustrates the third aspect of the present invention, converting the two dimensional feature into a three dimensional feature, and in particular, a feature sheet body to match the target sheet body. Illustrated in FIG. 6, sheet body design manager 108 operates to convert the extruded three dimensional feature 500 (shown in FIG. 5) into a second sheet body 600 with bends 610 and 611. As shown, the bends 610 and 611 of the feature sheet body are matched to the bends 210 and 211 of the sheet body 200. The thickness 520 of the feature sheet body 600 remains the same as the thickness 220 of the first sheet body 200. As will be appreciated by those skilled in the art, the above described approach for converting two dimensional feature represents significant improvement over the prior art in terms of incorporating features in a solid body.

Figure 7:
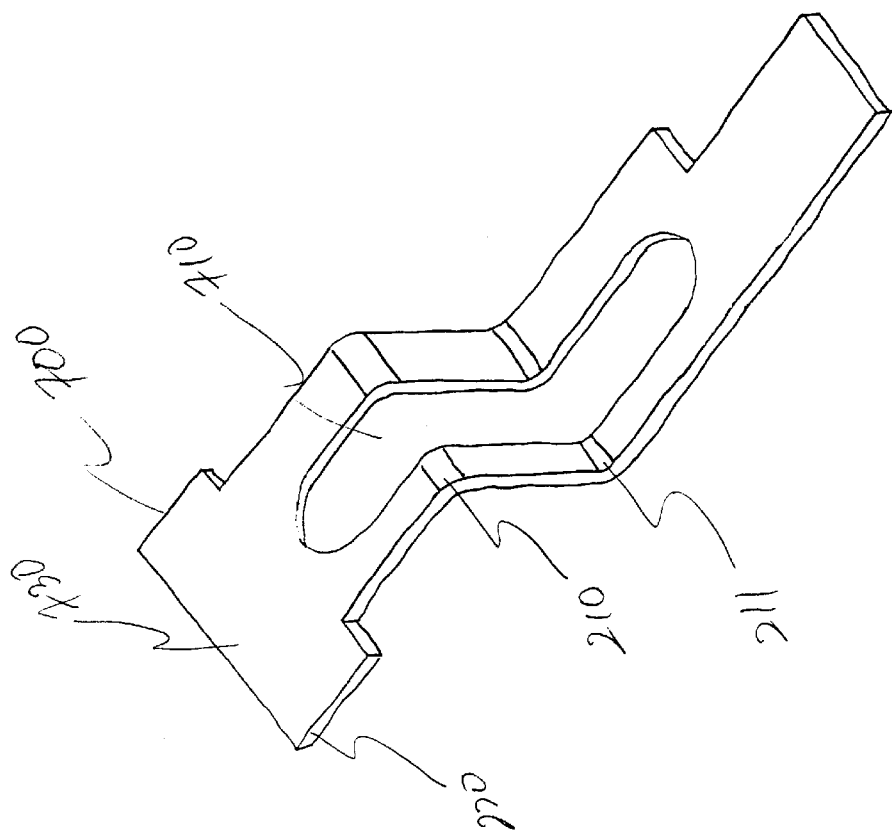
FIG. 7 illustrates a fourth aspect of the present invention, incorporating the three dimensional feature with the first three dimensional geometry piece to form a second three dimensional geometry piece.

FIG. 7 illustrates a fourth aspect of the present invention, incorporating the three dimensional feature with the first three dimensional geometry piece to form a second three dimensional geometry piece. In the illustrated embodiment, the sheet body design manager 108 operates to perform a subtraction of the feature sheet body 600 from the sheet body 200. As shown, the solid operation results in the second three dimensional geometry piece 700 with a slot 710 changing the surface area 230 to a new surface area 730 of the slotted sheet body 700. In the illustrated embodiment of the present invention of FIG. 7, the solid operation preformed is subtraction, however, it should be appreciated that the solid operation may be any solid operation known in the art such as but not limited to an addition operation.

FIG. 8 illustrates an example of the sheet body design manager 108 incorporating the three dimensional feature and editing the first three dimensional geometry piece. In the illustrated example, the sheet body design manager 108 operates to maintain the geometric constraint 410 (shown in FIG. 4) in response to a change in the sheet body 700 with slot 710 consistent with the present invention. In FIG. 8, the sheet body design manager 108 operates to alter the slot 710 of the original sheet body to a new slot 810 in response to a change in the original slotted sheet body 700 to the new sheet body 800 with a smaller surface area 830. As will be appreciated by those skilled in the art also, the above described approach for incorporating features into three dimensional geometry, in particular sheet bodies, also represents significant improvement over the prior art in terms of simplicity in constraining features to solid geometry and editing the features.

FIGS. 9a–9d illustrate the relevant operational flows of one embodiment of sheet body design manager 108 of FIG. 1. For the illustrated embodiment, sheet body design manager 108 is programmed in an event driven model, i.e. sheet body design manager 108 is designed to be executed in a system environment where various event notification services are available from the operating system. One example of such operating system suitable for practicing the present invention is the Windows® operating systems, available from Microsoft Corporation, of Redmond, Wash. In alternate embodiments, sheet body design manager 108 may be implemented in other programming approaches known in the art.

As shown in FIG. 9a, responsive to an event notification informing sheet body design manager 108 of the fact that the user has selected a two dimensional plane for projection, sheet body design manager 108 causes other functional blocks of design engine 104 to project a three dimensional sheet body onto the two dimensional plane, step 904. The manner in which the other functional blocks effectuate the projection may be implemented in any one of a number of manners known in the art.

As shown in FIG. 9b, responsive to an event notification informing sheet body design manager 108 of the fact that the user has created a two dimensional feature on the projected geometry and applied a geometric constraint, sheet body design manager 108 causes other functional blocks of design engine 104 to build a relationship between the two dimensional feature and the projected geometry, step 904. Similarly, the manner in which the other functional blocks effectuate the building of the relationship may be implemented also in any one of a number of manners known in the art.

As shown in FIG. 9c, responsive to an event notification informing sheet body design manager 108 of the fact that the user has selected a thickness for the two dimensional feature, sheet body design manager 108 causes other functional blocks of design engine 104 to convert the two dimensional feature into a three dimensional feature by extruding the two dimensional feature the thickness, step 906. Furthermore, the sheet body design manager 108 causes other functional blocks of design engine 104 to convert the three dimensional feature to a sheet body to match the target sheet body for the feature created, step 907. Similarly, the manner in which the other functional blocks effectuate the extrusion and sheet body conversion may be implemented also in any one of a number of manners known in the art.

As shown in FIG. 9d, responsive to an event notification informing sheet body design manager 108 of the fact that the user has selected the solid operation to be performed between the target sheet body and the feature, sheet body design manager 108 causes other functional blocks of design engine 104 to incorporate the three dimensional feature with the three dimensional geometry by performing the solid operation, step 909. Similarly, the manner in which the other functional blocks effectuate the incorporation may be implemented also in any one of a number of manners known in the art.

FIG. 10 illustrates one embodiment of a computer system suitable to be programmed with the mechanical design drawing application of the present invention. As shown, for the illustrated embodiment, computer 1000 includes processor 1002, processor bus 1006, high performance I/O bus 1010 and standard I/O bus 1020. Processor bus 1006 and high performance I/O bus 1010 are bridged by host bridge 1008, whereas I/O buses 1010 and 1012 are bridged by I/O bus bridge 1012. Coupled to processor bus 1006 is cache 1004. Coupled to high performance I/O bus 1010 are system memory 1014 and video memory 1016, against which video display 1018 is coupled. Coupled to standard I/O bus 1020 are disk drive 1022, keyboard and pointing device 1024, and communication interface 1026.

These elements perform their conventional functions known in the art. In particular, disk drive 1022 and system memory 1014 are used to store permanent and working copies of the mechanical design system. The permanent copies may be pre-loaded into disk drive 1022 in factory, loaded from distribution medium 1032 or down loaded from a remote distribution source (not shown). Distribution medium 1032 may be a tape, a CD, a DVD or other storage medium of the like. The constitutions of these elements are known. Any one of a number of implementations of these elements known in the art may be used to form computer system 1000.

In general, those skilled in the art will recognize that the present invention is not limited by the details described, instead, the present invention can be practiced with modifications and alterations within the spirit and scope of the appended claims. The description is thus to be regarded as illustrative instead of restrictive on the present invention.

Thus, a sheet body mechanical design application with improved facility for a designer, working with sheet bodies of a mechanical design, to incorporate and edit features has been described.

What is claimed is:

1. In a computer aided design (CAD) application, a method of operation comprising:

projecting a first three dimensional geometry piece of a mechanical design onto a two dimensional plane forming a projected geometry piece;

building a two dimensional feature on the projected geometry piece;

building a relationship between the two dimensional feature and the projected geometry piece;

automatically converting the two dimensional feature into a three dimensional feature; and automatically incorporating the three dimensional feature including the relationship with the first three dimensional geometry piece to form a second three dimensional geometry piece.

2. The method of operation of claim 1, wherein projecting the first three dimensional geometry piece comprises projecting a first sheet body.

3. The method of operation of claim 2, wherein projecting the first three dimensional geometry piece further comprises:

compensating for bends in the first sheet body; and controlling a surface area of the first three dimensional geometry piece on the projected geometry piece.

4. The method of operation of claim 1, wherein building a relationship between the two dimensional feature and the projected geometry piece comprises geometrically constraining the two dimensional feature to the projected geometry piece.

5. The method of operation of claim 1, wherein automatically converting the two dimensional feature into a three dimensional feature comprises extruding the two dimensional feature.

6. The method of operation of claim 5, wherein automatically converting the two dimensional feature further comprises generating a second sheet body from the three dimensional feature.

7. The method of operation of claim 1, wherein automatically incorporating the three dimensional feature with the first three dimensional geometry piece comprises performing a solid operation using the first sheet body and the second sheet body.

8. A storage medium having stored therein a plurality of instructions that are machine executable, wherein when executed, the executing instructions operate to project a first three dimensional geometry piece of a mechanical design onto a two dimensional plane forming a projected geometry piece, build a two dimensional feature on the projected geometry piece, build a relationship between the two dimensional feature and the projected geometry piece, automatically convert the two dimensional feature into a three dimensional feature, and automatically incorporate the three dimensional feature including the relationship with the first three dimensional geometry piece to form a second three dimensional geometry piece.

9. The storage medium of claim 8, wherein the executing instructions operate to project a first sheet body.

10. The storage medium of claim 9, wherein the executing instructions further operate to compensate for bends in the first sheet body and control a surface area of the first three dimensional geometry piece on the two dimensional projected geometry piece.

11. The storage medium of claim 8, wherein the executing instructions further operate to geometrically constrain the two dimensional feature to the projected geometry piece.

12. The storage medium of claim 8, wherein the executing instructions further operate to extrude the two dimensional feature.

13. The storage medium of claim 12, wherein the executing instructions further operate to generate a second sheet body from the three dimensional feature.

14. The storage medium of claim 8, wherein the executing instructions further operate to perform a solid operation using the first sheet body and the second sheet body.

15. An apparatus comprising:

a storage medium having stored therein a plurality of instructions that are machine executable, wherein when executed, the executing instructions operate to project a first three dimensional geometry piece of a mechanical design onto a two dimensional plane forming a projected geometry piece, build a two dimensional feature on the projected geometry piece, build a relationship between the two dimensional feature and the projected geometry piece, automatically convert the two dimensional feature into a three dimensional feature, and automatically incorporate the three dimensional feature including the relationship with the first three dimensional geometry piece to form a second three dimensional geometry piece; and a processor coupled to the storage medium to execute the instructions.

16. The apparatus of claim 15, wherein the executing instructions operate to project a first sheet body.

17. The apparatus of claim 16, wherein the executing instructions further operate to compensate for bends in the first sheet body and control a surface area of the first three dimensional geometry piece on the projected geometry piece.

18. The apparatus of claim 15, wherein the executing instructions further operate to geometrically constrain the two dimensional feature to the projected geometry piece.

19. The apparatus of claim 15, wherein the executing instructions further operate to extrude the two dimensional feature.

20. The apparatus of claim 19, wherein the executing instructions further operate to generate a second sheet body from the three dimensional feature.

21. The apparatus of claim 15, wherein the executing instructions further operate to perform a solid operation using the first sheet body and the second sheet body.

* * * * *